US009449892B2

(12) United States Patent
Aikawa et al.

(10) Patent No.: US 9,449,892 B2
(45) Date of Patent: Sep. 20, 2016

(54) MANUFACTURING METHOD OF MAGNETIC MEMORY DEVICE

(71) Applicants: Hisanori Aikawa, Seoul (KR); Masayoshi Iwayama, Seoul (KR); Akiyuki Murayama, Tokyo (KR)

(72) Inventors: Hisanori Aikawa, Seoul (KR); Masayoshi Iwayama, Seoul (KR); Akiyuki Murayama, Tokyo (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 30 days.

(21) Appl. No.: 14/636,984

(22) Filed: Mar. 3, 2015

(65) Prior Publication Data

US 2016/0071776 A1 Mar. 10, 2016

Related U.S. Application Data

(60) Provisional application No. 62/046,032, filed on Sep. 4, 2014.

(51) Int. Cl.
*H01L 21/66* (2006.01)
*H01L 43/12* (2006.01)
*H01L 27/22* (2006.01)
*H01L 29/82* (2006.01)
*H01L 43/08* (2006.01)

(52) U.S. Cl.
CPC .............. *H01L 22/20* (2013.01); *H01L 22/14* (2013.01); *H01L 43/12* (2013.01); *H01L 27/224* (2013.01); *H01L 29/82* (2013.01); *H01L 43/08* (2013.01)

(58) Field of Classification Search
None
See application file for complete search history.

(56) References Cited

U.S. PATENT DOCUMENTS

| 7,158,407 | B2 | 1/2007 | Rizzo et al. | |
| 7,187,166 | B2 | 3/2007 | Sugano | |
| 7,417,442 | B2 | 8/2008 | Hachisuka et al. | |
| 8,587,993 | B2 * | 11/2013 | Lee | G11C 11/169 365/157 |
| 8,750,031 | B2 * | 6/2014 | Kao | G11C 11/14 257/48 |
| 2013/0191048 | A1 * | 7/2013 | Li | G01R 33/098 702/58 |
| 2014/0252356 | A1 * | 9/2014 | Wang | H01L 27/222 257/48 |

FOREIGN PATENT DOCUMENTS

JP 2006032840 A 2/2006

OTHER PUBLICATIONS

U.S. Appl. No. 14/478,925; First Named Inventor: Tatsuya Kishi; Title: "Tester for Testing Magnetic Memory"; filed Sep. 5, 2014.

* cited by examiner

*Primary Examiner* — Andres Munoz
(74) *Attorney, Agent, or Firm* — Holtz, Holtz & Volek PC

(57) ABSTRACT

According to one embodiment, a manufacturing method of a magnetic memory device, includes obtaining first and second magnetic fields for each of magnetoresistive effect elements, defining a group of the elements, for the first and second magnetic fields of the elements in the group, a highest first magnetic field being lower than a lowest second magnetic field, and a difference between the highest first magnetic field and the lowest second magnetic field being greater than a predetermined difference, determining a maximum applied magnetic field higher than the highest first magnetic field and lower than the lowest second magnetic field, and obtaining magnetic characteristics for each of the elements in the group by applying a magnetic field decreasing from the maximum applied magnetic field after the magnetic field is increased up to the maximum applied magnetic field.

21 Claims, 9 Drawing Sheets

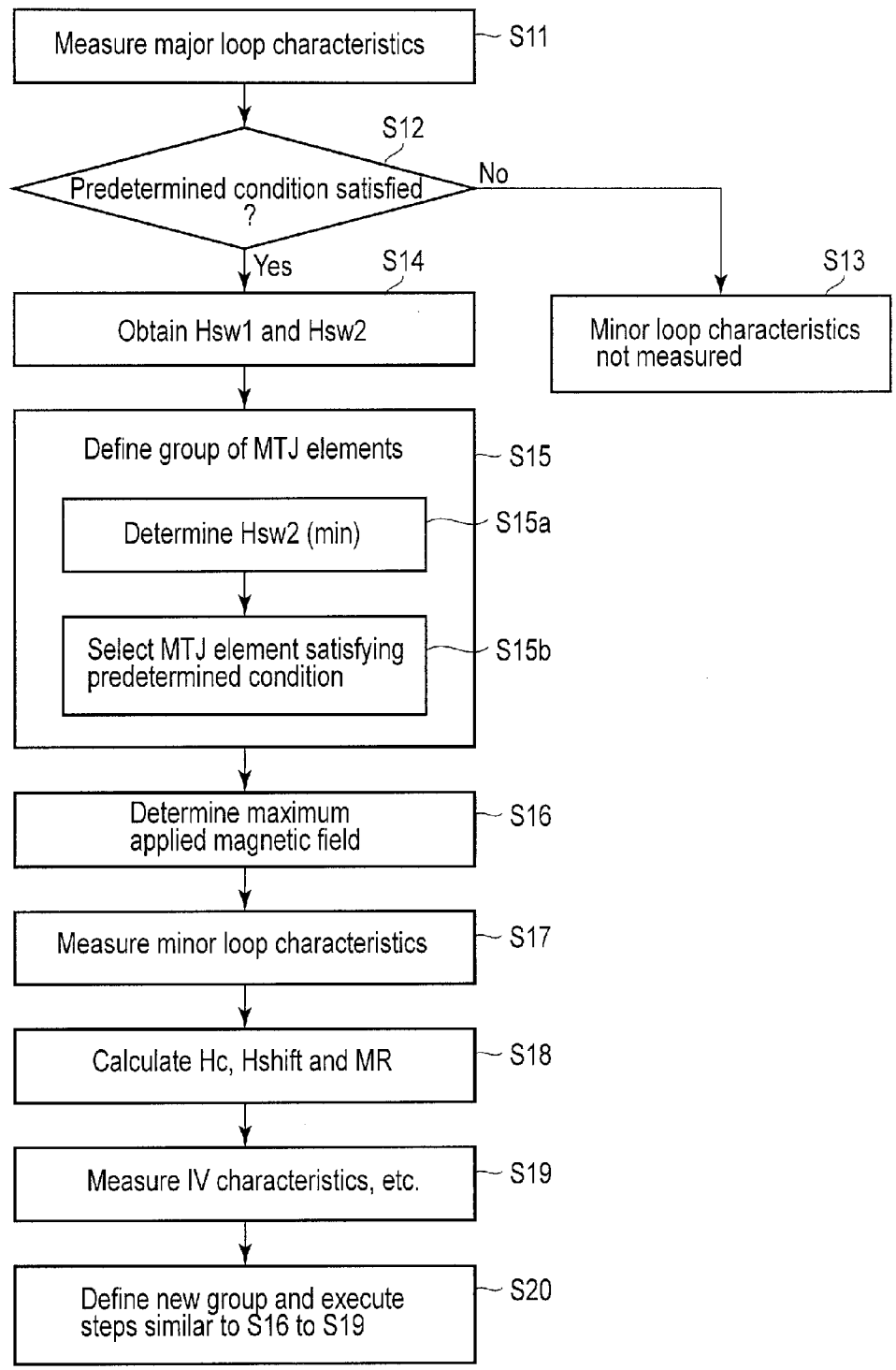
F I G. 7

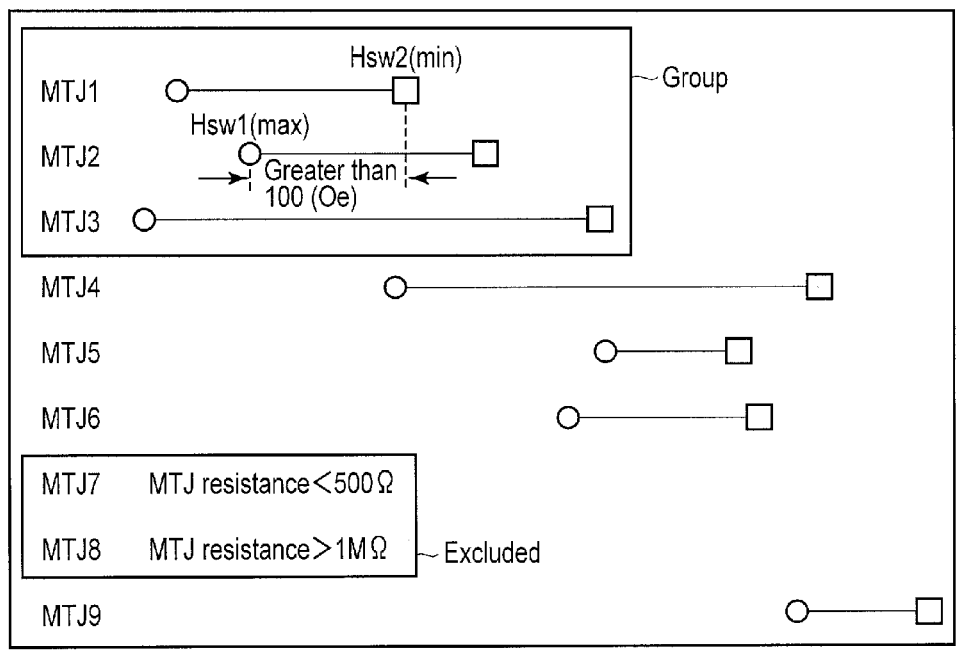
F I G. 8
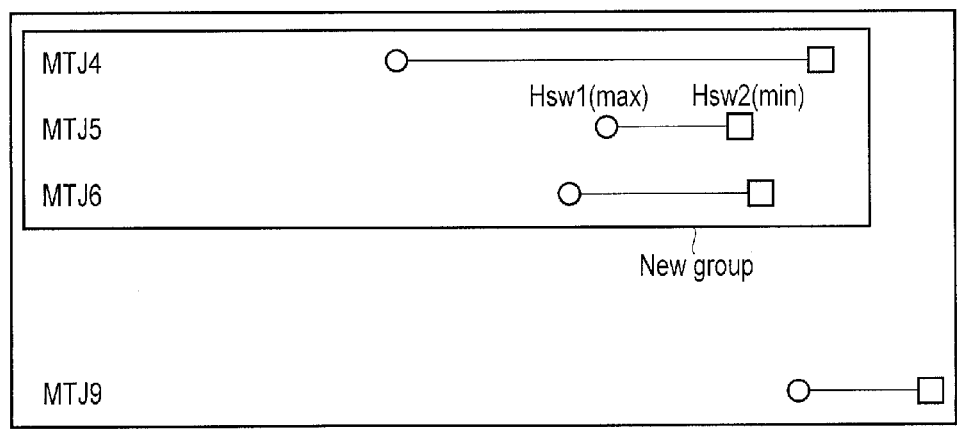
F I G. 9

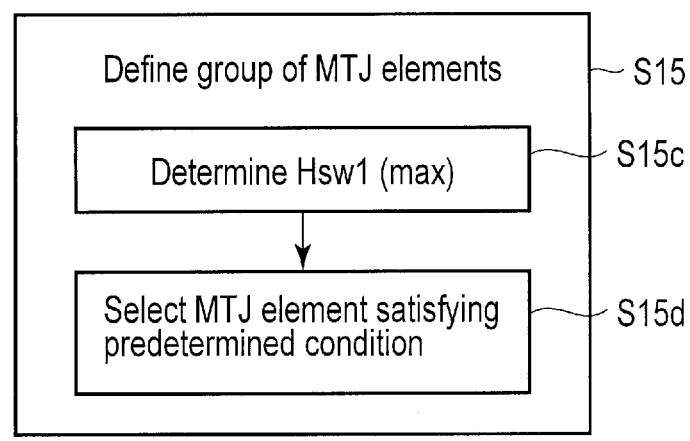
F I G. 10

MANUFACTURING METHOD OF MAGNETIC MEMORY DEVICE

CROSS-REFERENCE TO RELATED APPLICATIONS

This application claims the benefit of U.S. Provisional Application No. 62/046,032, filed Sep. 4, 2014, the entire contents of which are incorporated herein by reference.

FIELD

Embodiments described herein relate generally to a manufacturing method of a magnetic memory device.

BACKGROUND

A magnetic memory device in which magnetoresistive effect elements are formed on a semiconductor substrate is proposed. In the magnetic memory device, magnetic characteristics of elements must be evaluated.

However, in the past, the magnetic characteristics of the elements were hard to appropriately evaluate in a short time. Thus, a method for appropriately evaluating the magnetic characteristics of the elements in a short time has been desired.

BRIEF DESCRIPTION OF THE DRAWINGS

FIG. 7 is a flowchart showing a manufacturing method of the magnetic memory device according to the first embodiment (characteristics evaluation method of the magnetic memory device).

FIG. 8 is a figure for describing the method of the first embodiment.

FIG. 9 is a figure for describing the method of the first embodiment.

FIG. 10 is a flowchart showing part of the manufacturing method of the magnetic memory device according to a modified example of the first embodiment (characteristics evaluation method of the magnetic memory device).

DETAILED DESCRIPTION

In general, according to one embodiment, a manufacturing method of a magnetic memory device comprising a plurality of magnetoresistive effect elements, each of which comprises a storage layer, a reference layer and a tunnel barrier layer provided between the storage layer and the reference layer, when an applied magnetic field is increased, the magnetoresistive effect elements being in a first resistance state if the applied magnetic field is lower than a first magnetic field, the magnetoresistive effect elements being in a second resistance state having a resistance greater than a resistance of the first resistance state if the applied magnetic field is higher than the first magnetic field and lower than a second magnetic field, and the magnetoresistive effect elements being in a third resistance state having a resistance less than the resistance of the second resistance state if the applied magnetic field is higher than the second magnetic field. The method includes: obtaining the first and second magnetic fields for each of the magnetoresistive effect elements; defining a group of the magnetoresistive effect elements, for the first and second magnetic fields of the magnetoresistive effect elements in the group, a highest first magnetic field being lower than a lowest second magnetic field, and a difference between the highest first magnetic field and the lowest second magnetic field being greater than a predetermined difference; determining a maximum applied magnetic field higher than the highest first magnetic field and lower than the lowest second magnetic field; and obtaining magnetic characteristics for each of the magnetoresistive effect elements in the group by applying a magnetic field decreasing from the maximum applied magnetic field after the magnetic field is increased up to the maximum applied magnetic field.

Various embodiments will be described hereinafter with reference to the accompanying drawings.

(First Embodiment)

Figure 1:
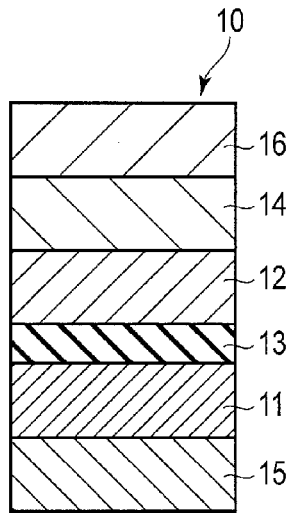
FIG. 1 is a sectional view schematically showing a first basic structural example of a magnetoresistive effect element included in a magnetic memory device according to a first embodiment.

FIG. 1 is a sectional view schematically showing a first basic structural example of a magnetoresistive effect element included in a magnetic memory device according to this embodiment. It should be noted that since the magnetoresistive effect element is sometimes called a magnetic tunnel junction (MTJ) element, the magnetoresistive effect element is hereinafter called an MTJ element in the following description.

As shown in FIG. 1, a magnetoresistive effect element (MTJ element) 10 comprises a storage layer 11, a reference layer 12 and a tunnel barrier layer 13 provided between the storage layer 11 and the reference layer 12. Further, the MTJ element 10 comprises a shift cancelling layer 14, an underlayer 15 and a cap layer 16. In this basic structural example, the shift cancelling layer 14 is provided on an upper layer side. Thus, the reference layer 12 is provided between the tunnel barrier layer 13 and the shift cancelling layer 14.

Figure 2:
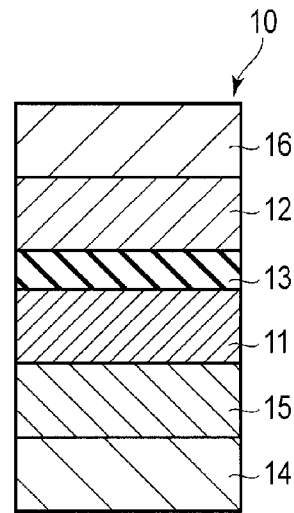
FIG. 2 is a sectional view schematically showing a second basic structural example of the magnetoresistive effect element included in the magnetic memory device according to the first embodiment.

FIG. 2 is a sectional view schematically showing a second basic structural example of the magnetoresistive effect element included in the magnetic memory device according to this embodiment.

As shown in FIG. 2, the MTJ element (magnetoresistive effect element) 10 of this basic structural example as well as the above-described first basic structural example comprises the storage layer 11, the reference layer 12, the tunnel barrier layer 13, the shift cancelling layer 14, the underlayer 15 and the cap layer 16. In this basic structural example, the shift cancelling layer 14 is provided on a lower layer side. Thus, the storage layer 12 and the underlayer 15 are provided between the tunnel barrier layer 13 and the shift cancelling layer 14.

In the above-described first and second basic structural examples, the storage layer 11 is intended to store binary information (0 or 1), and has a variable magnetization direction in a usual operating range. The storage layer 11 is formed of a magnetic body including at least one of cobalt (Co) and iron (Fe).

The reference layer 12 is formed of a magnetic body having a fixed magnetization direction in a usual operating range. The reference layer 12 is formed of a magnetic body including at least one of cobalt (Co) and iron (Fe).

The tunnel barrier layer 13 is formed of a non-magnetic body having insulation properties. Specifically, the tunnel barrier layer 13 is formed of MgO.

The shift cancelling layer 14 is intended to apply a magnetic field having a direction opposite to that of a magnetic field applied from the reference layer 12 to the storage layer 11 to the storage layer 11. The shift cancelling layer 14 is formed of a magnetic body including at least one of cobalt (Co) and iron (Fe).

The underlayer 15 is formed of a metal compound. For example, a material containing a metal element and at least one of oxygen and nitrogen is used for the underlayer 15.

The cap layer 16 is formed of a metal layer. Specifically, the cap layer 16 is formed of a metal layer including at least one of tantalum (Ta), platinum (Pt), ruthenium (Ru) and tungsten (W).

The above-described MTJ element 10 is a magnetic element having perpendicular magnetization. That is, the magnetization directions of the storage layer 11, the reference layer 12 and the shift cancelling layer 14 are perpendicular to the surfaces of these layers. If the magnetization direction of the storage layer 11 and that of the storage layer 12 are parallel to each other, the MTJ element 10 attains a low-resistance state. If the magnetization direction of the storage layer 11 and that of the storage layer 12 are antiparallel to each other, the MTJ element 10 attains a high-resistance state. The binary information (0 or 1) can be stored depending on whether the MTJ element 10 is in the low-resistance state or in the high-resistance state. The binary information (0 or 1) can be written in accordance with a direction of a current flowing to the MTJ element 10.

Figure 3:
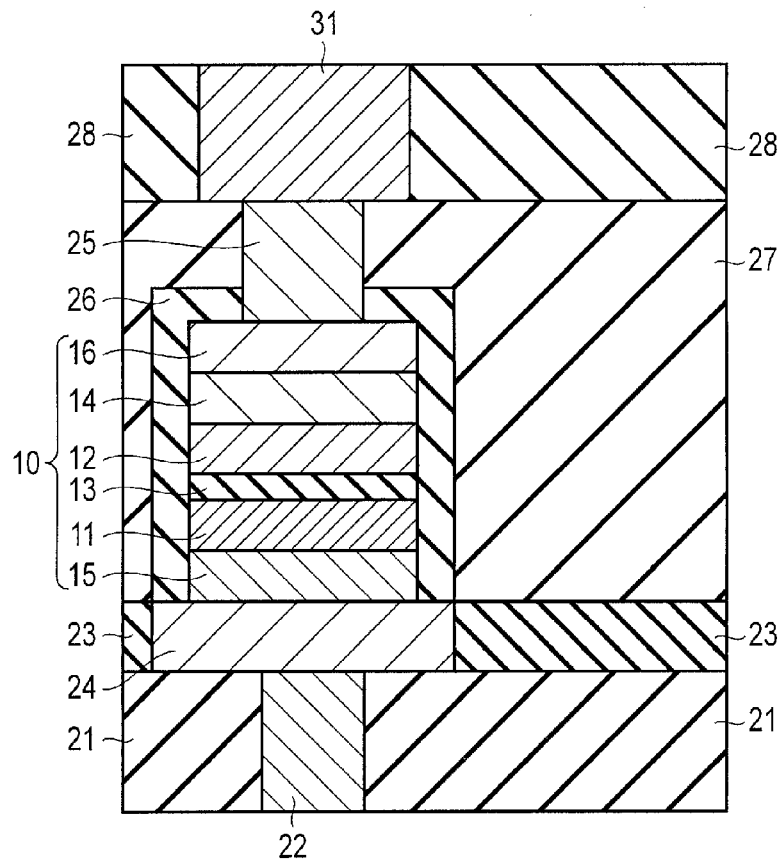
FIG. 3 is a sectional view schematically showing a structure of the magnetic memory device according to the first embodiment, including an MTJ element.

FIG. 3 is a sectional view schematically showing a structure of the magnetic memory device including the MTJ element 10 as described above.

The structure shown in FIG. 3 is provided on a lower area including a semiconductor substrate (not shown), a select transistor (not shown), etc.

A lower plug 22 is provided in an interlayer dielectric film 21, and the lower plug 22 is connected to the select transistor (not shown). A silicon nitride film 23 is formed on the interlayer dielectric film 21, and a lower electrode 24 is provided in the silicon nitride film 23.

The MTJ element 10 is provided on the lower electrode 24. As described above, the MTJ element 10 comprises a stack structure of the storage layer 11, the reference layer 12, the tunnel barrier layer 13, the shift cancelling layer 14, the underlayer 15 and the cap layer 16. It should be noted that the MTJ element 10 shown in FIG. 3 is identical to the MTJ element 10 shown in FIG. 1 in structure; however, it may be identical to the MTJ element 10 shown in FIG. 2 in structure.

An upper plug 25 is formed on the cap layer 16. Further, a silicon nitride film 26 is formed around the MTJ element 10 as a protection film. The upper plug 25 and the silicon nitride film 26 are surrounded by an interlayer dielectric film 27.

An interlayer dielectric film 28 is formed on the interlayer dielectric film 27. A bit-line 31 is provided in the interlayer dielectric film 28. The bit-line 31 is connected to the upper plug 25.

Figure 4:
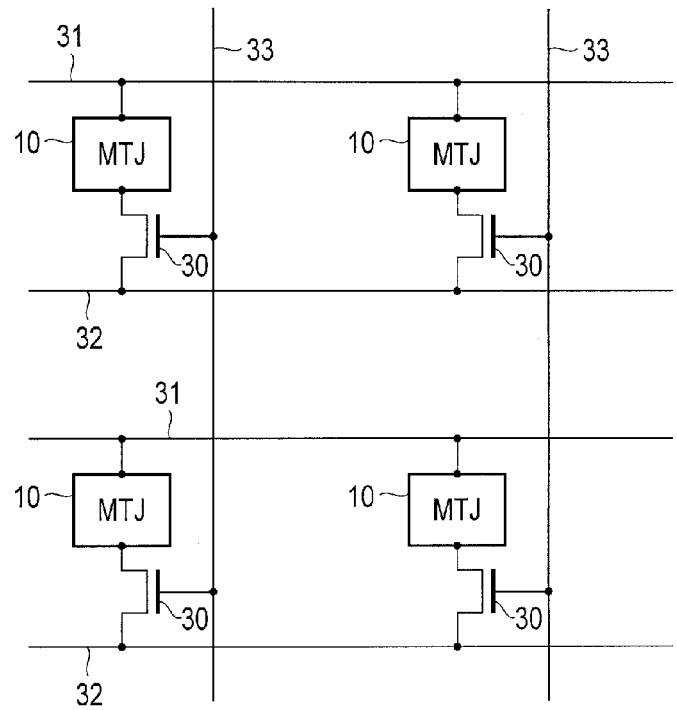
FIG. 4 is a circuit diagram showing a structure of the magnetic memory device according to the first embodiment, including the MTJ element.

FIG. 4 is a circuit diagram showing a structure of the magnetic memory device including the MTJ element 10 as described above.

As shown in FIG. 4, one end of a select transistor 30 is electrically connected to one end of the MTJ element 10. A memory cell is constituted by the MTJ element 10 and the select transistor 30, and a plurality of memory cells are arranged in an array. The bit-line 31 is connected to the other end of the MTJ element 10, and a source line 32 is connected to the other end of the select transistor 30. Further, a word line 33 is connected to a gate of the select transistor 30. Writing and reading can be performed to and from the MTJ element 10 by controlling the select transistor 30 by a control signal supplied from the word line 33.

Next, characteristics of the MTJ element 10 (relationship between an applied magnetic field and resistance) will be described. Basic characteristics of the MTJ element 10 in FIG. 1 are identical to that in FIG. 2.

Figure 5:
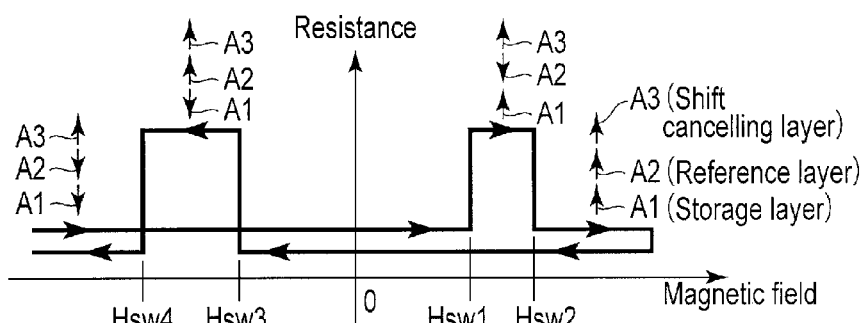
FIG. 5 schematically shows major loop characteristics of the MTJ element according to the first embodiment.
Figure 6:
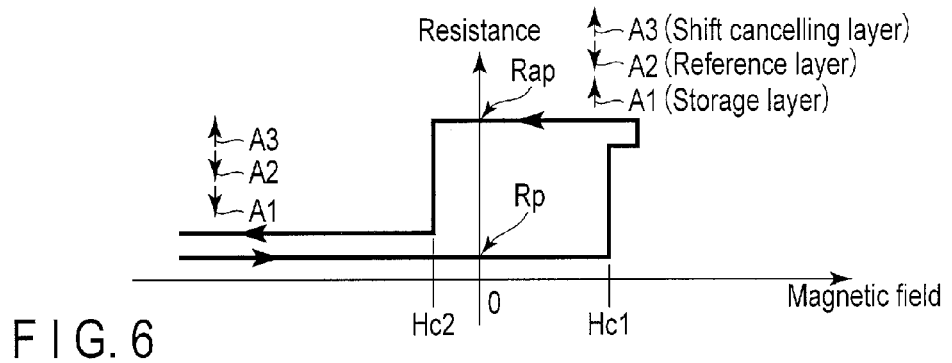
FIG. 6 schematically shows minor loop characteristics of the MTJ element according to the first embodiment.

FIG. 5 schematically shows major loop characteristics of the MTJ element 10. FIG. 6 schematically shows minor loop characteristics of the MTJ element 10. Both of the major loop characteristics and the minor loop characteristics represent magnetic hysteresis characteristics of the MTJ element 10. In FIGS. 5 and 6, horizontal axes indicate a magnetic field (external magnetic field) applied to the MTJ element 10, and vertical axes indicate resistance of the MTJ element 10. It should be noted that arrows A1, A2 and A3 shown in the figures indicate magnetization directions of the storage layer 11, the reference layer 12 and the shift cancelling layer 14, respectively.

First, the major loop characteristics will be described with reference to FIG. 5. It should be noted that in FIG. 5, a resistance in the low-resistance state is described to be different between a time when the magnetic field increases and a time when the magnetic field decreases for convenience; however, in reality, the resistance in the low-resistance state is not substantially different between the time when the magnetic field increases and the time when the magnetic field decreases.

As shown in FIG. 5, measurement is started in a state where a magnetic field in a negative direction is applied to the MTJ element 10. The magnetization direction of the storage layer 11 is parallel to that of the reference layer 12 when the measurement is started. After the measurement is started, the applied magnetic field is increased toward a positive direction.

If the applied magnetic field is lower than a first magnetic field Hsw1, the magnetization direction of the storage layer 11 is parallel to that of the reference layer 12. Thus, if the applied magnetic field is lower than the first magnetic field Hsw1, the MTJ element 10 is in a first resistance state (low-resistance state).

When the applied magnetic field is increased and the applied magnetic field becomes higher than the first magnetic field Hsw1, the magnetization direction of the storage layer 11 is reversed. As a result, the magnetization direction of the storage layer 11 becomes antiparallel to that of the reference layer 12. When the applied magnetic field is further increased and the applied magnetic field becomes higher than a second magnetic field Hsw2, the magnetization direction of the reference layer 12 is also reversed. As a result, the magnetization direction of the storage layer 11 becomes parallel to that of the reference layer 12.

As can be seen from the above, if the applied magnetic field is higher than the first magnetic field Hsw1 and lower than the second magnetic field Hsw2, the MTJ element 10 is in a second resistance state (high-resistance state) having a resistance greater than that of the first resistance state (low-resistance state). Further, if the applied magnetic field is higher than the second magnetic field Hsw2, the MTJ element 10 is in a third resistance state (low-resistance state) having a resistance less than that of the second resistance state (high-resistance state). Usually, the resistance in the third resistance state (low-resistance state) is equal to that in the first resistance state (low-resistance state).

After the applied magnetic field reaches a maximum applied magnetic field, the applied magnetic field is decreased. When the applied magnetic field becomes lower than third magnetic field Hsw3, the magnetization direction of the storage layer 11 is reversed. As a result, the magnetization direction of the storage layer 11 becomes antiparallel to that of the reference layer 12, and the MTJ element 10 attains a fourth resistance state (high-resistance state). Usually, the resistance of the fourth resistance state (high-resistance state) is equal to that of the second resistance state (high-resistance state). When the applied magnetic field is further decreased and the applied magnetic field becomes lower than fourth magnetic field Hsw4, the magnetization direction of the reference layer 12 is also reversed. As a result, the magnetization direction of the storage layer 11 becomes parallel to that of the reference layer 12, and the MTJ element 10 returns to the first resistance state (low-resistance state).

Next, the minor loop characteristics will be described with reference to FIG. 6. It should be noted that in FIG. 6, a resistance in the low-resistance state is described to be different between a time when the magnetic field increases and a time when the magnetic field decreases for convenience; however, in reality, the resistance in the low-resistance state is not substantially different between the time when the magnetic field increases and the time when the magnetic field decreases.

To obtain the above-described major loop characteristics, the magnetic field is applied to the MTJ element 10 up to the magnetic field higher than the second magnetic field Hsw2. To obtain the minor loop characteristics, the magnetic field is applied up to the magnetic field higher than the first magnetic field Hsw1 and lower than the second magnetic field Hsw2.

As shown in FIG. 6, measurement is started in a state where a magnetic field in a negative direction is applied to the MTJ element 10. When the measurement is started, the magnetization direction of the storage layer 11 is parallel to that of the reference layer 12. After the measurement is started, the applied magnetic field is increased toward a positive direction.

If the applied magnetic field is lower than magnetic field Hc1, the magnetization direction of the storage layer 11 is parallel to that of the reference layer 12. Thus, if the applied magnetic field is lower than magnetic field Hc1, the MTJ element 10 is in the low-resistance state. It should be noted that magnetic field Hc1 is equal to the first magnetic field Hsw1 of the major loop characteristics.

When the applied magnetic field is increased and the applied magnetic field becomes higher than magnetic field Hc1, the magnetization direction of the storage layer 11 is reversed. As a result, the magnetization direction of the storage layer 11 becomes antiparallel to that of the reference layer 12. After that, the magnetic field is applied up to a maximum applied magnetic field higher than the first magnetic field Hsw1 of the major loop characteristics and lower than the second magnetic field Hsw2.

After the applied magnetic field reaches the maximum applied magnetic field, the applied magnetic field is decreased. Then, when the applied magnetic field becomes lower than magnetic field Hc2, the magnetization direction of the storage layer 11 is reversed. As a result, the magnetization direction of the storage layer 11 becomes parallel to that of the reference layer 12, and the MTJ element 10 returns to the low-resistance state.

To acquire characteristics (parameter) finally necessary in characteristics evaluation of the MTJ element, magnetic field Hc1, magnetic field Hc2, resistance Rp and resistance Rap must be obtained from the minor loop characteristics shown in FIG. 6.

Magnetic field Hc1 is a magnetic field when the MTJ element is shifted from the low-resistance state to the high-resistance state. Magnetic field Hc2 is a magnetic field when the MTJ element is shifted from the high-resistance state to the low-resistance state. Resistance Rp is resistance of the MTJ element when the applied magnetic field becomes zero in a case where the applied magnetic field is being increased. Resistance Rpa is resistance of the MTJ element when the applied magnetic field becomes zero in a case where the applied magnetic field is being decreased.

When magnetic field Hc1, magnetic field Hc2, resistance Rp and resistance Rap are acquired, finally necessary characteristics (parameters) Hc, Hshift and MR are calculated from the following equations:

$Hc=(Hc1-Hc2)/2$ $Hshift=Hc1-Hc$ $MR=\{(Rap-Rp)/Rp\}\times 100$

As can be seen from the already-described matters, to acquire the minor loop characteristics, the maximum applied magnetic field must be obtained in advance. The maximum applied magnetic field is a magnetic field between the first magnetic field Hsw1 and the second magnetic field Hsw2 which are acquired by the major loop characteristics. If the maximum applied magnetic field is lower than the first magnetic field Hsw1 or higher than the second magnetic field Hsw2, the minor loop characteristics cannot be acquired. Thus, to measure the minor loop characteristics, the magnetic field between the first magnetic field Hsw1 and the second magnetic field Hsw2 must be obtained in advance as the maximum applied magnetic field.

However, in general, the first magnetic field Hsw1 and the second magnetic field Hsw2 are different for each MTJ element. Thus, it is necessary to obtain the first magnetic field Hsw1 and the second magnetic field Hsw2 for each MTJ element by measuring the major loop characteristics for each MTJ element, and to obtain the maximum applied magnetic field for each MTJ element from the obtained the first magnetic field Hsw1 and the second magnetic field Hsw2. Then, a maximum applied magnetic field different for each MTJ element must be set to measure the minor loop characteristics.

However, it takes a lot of time to set the maximum applied magnetic field different for each MTJ element to measure the minor loop characteristics of a plurality of MTJ elements. Accordingly, the characteristics (parameters) of the MTJ elements cannot be efficiently acquired in a short time, and characteristics evaluation of the magnetic memory device cannot be efficiently performed. Then, a method as described below is adopted in this embodiment.

FIG. 7 is a flowchart showing a manufacturing method of the magnetic memory device according to this embodiment (characteristics evaluation method of the magnetic memory device).

The following description will be made with reference to also FIGS. 8 and 9. In FIGS. 8 and 9, nine MTJ elements (MTJ1 to MTJ9) are supposed as objects to be measured for simplification of description. Further, in FIGS. 8 and 9, a circle indicates the first magnetic field Hsw1 and a square indicates the second magnetic field Hsw2.

First, the major loop characteristics as shown in FIG. 5 are measured for each MTJ element (S11). When the major loop characteristics are measured, the magnetic field higher than the second magnetic field Hsw2 must be surely applied to the MTJ element; thus, the magnetic field sufficiently higher than the second magnetic field Hsw2 is set as a maximum applied magnetic field.

Next, whether each of the measured major loop characteristics satisfies a predetermined condition or not is determined (S12). Specifically, whether the resistance of the MTJ element is between a predetermined low threshold resistance and a predetermined high threshold resistance or not is determined. If the resistance of the MTJ element (resistance in the low-resistance state) is less than the low threshold resistance (for example, 500 Ω), the MTJ element is likely to have a short-circuit defect. Further, if the resistance of the MTJ element (resistance in the high-resistance state) is greater than the high threshold resistance (for example, 1 MΩ), the MTJ element is likely to have an open defect. Thus, determination as described above is performed.

If the major loop characteristics of the MTJ element do not satisfy the predetermined condition, it is considered that the MTJ element has a defect, and the minor loop characteristics are not measured (S13). In the example of FIG. 8, two MTJ elements (MTJ7 and MTJ8) do not satisfy the predetermined condition. Thus, the two MTJ elements (MTJ7 and MTJ8) are excluded from the measurement of the minor loop characteristics.

The following steps are executed for the MTJ elements in which the major loop characteristics satisfy the predetermined condition.

First, the first magnetic field Hsw1 and the second magnetic field Hsw2 are obtained for each of a plurality of MTJ elements (S14). That is, the first magnetic field Hsw1 and the second magnetic field Hsw2 are obtained for each MTJ element from each major loop characteristic of each MTJ element.

Next, a group of MTJ elements is defined (S15). In the defined group, the highest first magnetic field Hsw1 (max) is lower than the lowest second magnetic field Hsw2 (min), and the difference between the highest first magnetic field Hsw1 (max) and the lowest second magnetic field Hsw2 (min) is greater than a predetermined difference with respect to the first magnetic field Hsw1 and the second magnetic field Hsw2 of the MTJ element in the group. The predetermined difference is a certain value greater than zero. A specific method of defining the group of MTJ elements will be described below.

First, the lowest second magnetic field Hsw2 (min) is determined from the second magnetic field Hsw2 obtained by the measurement of the major loop characteristics (S15a). It should be noted that in this case, MTJ elements (MTJ7 and MTJ8) determined not to satisfy the predetermined condition in step S12 are excluded from the determination. In the example shown in FIG. 8, MTJ1 has the lowest second magnetic field Hsw2 (min).

Next, the MTJ element satisfying the predetermined condition is selected (S15b). Specifically, the MTJ element in which the first magnetic field Hsm1 obtained by the measurement of the major loop characteristics is lower than the lowest second magnetic field Hsw2 (min) and the difference between the first magnetic field Hsm1 and the lowest second magnetic field Hsw2 (min) is greater than the predetermined difference is selected. For example, the predetermined difference is set 100 (Oe). That is, the MTJ element satisfying the following condition is selected:

$$Hsw1 + 100 < Hsw2(min)$$

in the example of FIG. 8, three MTJ elements (MTJ1 to MTJ3) satisfy the above predetermined condition, and are selected. The group of MTJ elements is defined in above-described steps S15a and S15b. In the example of FIG. 8, a group including the three MTJ elements (MTJ1 to MTJ3) is defined. In the defined group, MTJ2 has the highest first magnetic field Hsw1 (max), and MTJ1 has the lowest second magnetic field Hsw2 (min). Then, the highest first magnetic field Hsw1 (max) is lower than the lowest second magnetic field Hsw2 (min), and the difference between the highest first magnetic field Hsw1 (max) and the lowest second magnetic field Hsw2 (min) is greater than the predetermined difference (100 (Oe)).

Next, a magnetic field higher than the above-described highest first magnetic field Hsw1 (max) and lower than the lowest second magnetic field Hsw2 (min) is determined as a maximum applied magnetic field (S16). This maximum applied magnetic field corresponds to a maximum magnetic field applied to the MTJ element when the minor loop characteristics are measured. For example, a magnetic field Hmid located midway between Hsw1 (max) and Hsw2 (min) is determined as the maximum applied magnetic field. In this case, the following relationship is established:

$$Hmid = (Hsw1(max) + Hsw2(min))/2$$

Next, the minor loop characteristics as shown in FIG. 6 are measured for each MTJ element (S17). Specifically, the magnetic characteristics (magnetic hysteresis characteristics) are obtained for each of the MTJ elements (MTJ1 to MTJ3) in the group defined as described above by applying the magnetic field decreasing from the maximum applied magnetic field (intermediate magnetic field Hmid) after the magnetic field is increased up to the maximum applied magnetic field (intermediate magnetic field Hmid). Magnetic field Hc1, magnetic field Hc2, resistance Rp and resistance Rap are obtained for each MTJ element in the group from the measured minor loop characteristics. Next, finally necessary characteristics (parameters) Hc, Hshift and MR are calculated for each MTJ element in the group using the measurement result of the minor loop characteristics (S18).

Next, current-voltage characteristics (IV characteristics), etc., are measured for each MTJ element in the group based on the calculated characteristics (parameter) Hc, Hshift and MR (S19). For example, the current-voltage characteristics (IV characteristics), etc., are measured with such a magnetic field where Hshift is cancelled applied to the MTJ element.

In such a manner, the necessary characteristics are acquired for each of the MTJ elements (MTJ1 to MTJ3) in the group. The minor loop characteristics are measured for the MTJ elements (MTJ1 to MTJ3) in the group using a common maximum applied magnetic field (intermediate magnetic field Hmid). Thus, since the maximum applied magnetic field (intermediate magnetic field Hmid) need not be set for each MTJ element, the characteristics of the MTJ element can be efficiently acquired in a short time.

Next, a new group of MTJ elements which do not belong to the group defined in step S15 is defined in a manner similar to the method described in step S15, and steps similar to S16 to S19 are executed (S20). Specific steps will be described below.

In above-described steps S11 to S19, MTJ7 and MTJ8 are excluded from measurement, and the measurement of MTJ1 to MTJ3 is terminated. Accordingly, as shown in FIG. 9, MTJ4 to MTJ6 and MTJ9 are left as objects to be measured. Thus, a new group is defined for the four MTJ elements (MTJ4 to MTJ6 and MTJ9) in a manner similar to step S15.

In the example of FIG. 9, a new group including three MTJ elements (MTJ4 to MTJ6) is defined. In the defined new group, MTJ5 has a new highest first magnetic field Hsw1 (max) and a new lowest second magnetic field Hsw2 (min). Further, the difference between the new highest first magnetic field Hsw1 (max) and the new lowest second magnetic field Hsw2 (min) is greater than the predetermined difference (100 (Oe)).

Steps similar to S16 to S19 are executed for the new group defined in this manner.

First, in step S16, a new maximum applied magnetic field higher than the new highest first magnetic field Hsw1 (max) and lower than the new lowest second magnetic field Hsw2 (min) is determined. For example, a magnetic field Hmid located midway between new Hsw1 (max) and new Hsw2 (min) is determined as the new maximum applied magnetic field.

Next, in step S17, minor loop characteristics as shown in FIG. 6 are measured for each MTJ element in the new group. That is, magnetic characteristics (magnetic hysteresis characteristics) are obtained for each of the MTJ elements (MTJ4 to MTJ6) in the new group by applying the magnetic field decreasing from the new maximum applied magnetic field (intermediate magnetic field Hmid) after the magnetic field is increased up to the new maximum applied magnetic field (intermediate magnetic field Hmid). This causes magnetic field Hc1, magnetic field Hc2, resistance Rp and resistance Rap to be obtained for each MTJ element in the new group.

Processing similar to the already-described processing is executed also in steps S18 and S19.

In such a manner, necessary characteristics are acquired for each of the MTJ elements (MTJ4 to MTJ6) in the new group. Minor loop characteristics are measured for each of the MTJ elements (MTJ4 to MTJ6) in the group using a common new maximum applied magnetic field (intermediate magnetic field Hmid).

After the above-described processing is executed, only MTJ9 is left as the MTJ element in which the measurement of the minor loop characteristics is not executed. Thus, the group of MTJ9 is defined as a further new group, and processing similar to the above-described processing is executed for the group of MTJ9.

In such a manner, the measurement of the minor loop characteristics is executed for all the MTJ elements (MTJ1 to MTJ6 and MTJ9) except for the MTJ elements (MTJ7 and MTJ8) excluded from the objects to be measured, and the necessary characteristics are acquired using the measurement result of the minor loop characteristics.

As described above, in this embodiment, the minor loop characteristics can be measured for the MTJ elements in the group using the common maximum applied magnetic field. Accordingly, the maximum applied magnetic field need not be set for each MTJ element. Thus, the characteristics of the MTJ elements can be efficiently acquired in a short time, and characteristics evaluation of the magnetic memory device can be efficiently performed. Further, in this embodiment, the minor loop characteristics are measured in order from groups having smaller maximum applied magnetic fields. Thus, the characteristics evaluation can be efficiently performed also from this viewpoint.

It should be noted that in the above-described embodiment, the MTJ element satisfying the predetermined condition is selected in step S15b to set the group of MTJ elements in step S15 after the lowest second magnetic field Hsw2 (min) is determined in step S15a; however, the MTJ element satisfying the predetermined condition may be selected after the highest first magnetic field Hsw1 (max) is determined.

FIG. 10 is a flowchart showing part of the method of the above-described modified example. It should be noted that since a basic method is similar to that in the above-described embodiment, description of the matters described in the above-described embodiment will be omitted.

In this modified example, after step S14 in FIG. 7 is executed, the group of MTJ elements is defined in step S15. A specific method of defining the group of MTJ elements will be hereinafter described in this modified example.

First, the highest first magnetic field Hsw1 (max) is determined from the first magnetic field Hsw1 obtained by measuring the major loop characteristics (S15c).

Next, the MTJ element satisfying the predetermined condition is selected (S15d). Specifically, the MTJ element in which the second magnetic field Hsw2 obtained by measuring the major loop characteristics is higher than the highest first magnetic field Hsw1 (max), and the difference between the second magnetic field Hsw2 and the highest first magnetic field Hsw1 (max) is greater than the predetermined difference is selected. For example, the predetermined difference is set 100 (Oe). That is, the MTJ element satisfying the following condition is selected:

$$Hsw2-100>Hsw1(\text{max})$$

The group of MTJ elements is defined by above-described steps S15c and S15d. A subsequent basic step is similar to that in the above-described embodiment.

In this modified example as well as in the above-described embodiment, the minor loop characteristics can be measured for the MTJ elements in the group using the common maximum applied magnetic field. Thus, also in this modified example, the characteristics of the MTJ elements can be efficiently acquired in a short time, and the characteristics evaluation of the magnetic memory device can be efficiently performed.

It should be noted that in the above-described embodiment and modified example, the group of MTJ elements is defined in step S15, and steps S16 to S19 are performed for the defined group. After that, a new group is defined, and steps S16 to S19 are performed for the defined new group. That is, steps S16 to S19 are performed for the group defined every time the group is defined. However, a plurality of groups may be predefined by repeating step S15, and steps S16 to S19 may be repeatedly performed for each of a plurality of groups defined after that.

(Second Embodiment)

Next, a second embodiment will be described. It should be noted that since basic matters are similar to those in the above-described first embodiment, description of the matters described in the first embodiment will be omitted.

In the above-described first embodiment, major loop characteristics are first measured, and the first magnetic field Hsw1 and the second magnetic field Hsw2 are obtained. When the major loop characteristics are measured, a magnetic field higher than the second magnetic field Hsw2 must be surely applied to an MTJ element; thus, a magnetic field sufficiently higher than the second magnetic field Hsw2 is set as a maximum applied magnetic field. However, it is sometimes difficult to prepare a measuring device which can generate a sufficiently high magnetic field. The method of this embodiment allows minor loop characteristics to be accurately acquired even in such a case.

Figure 11:
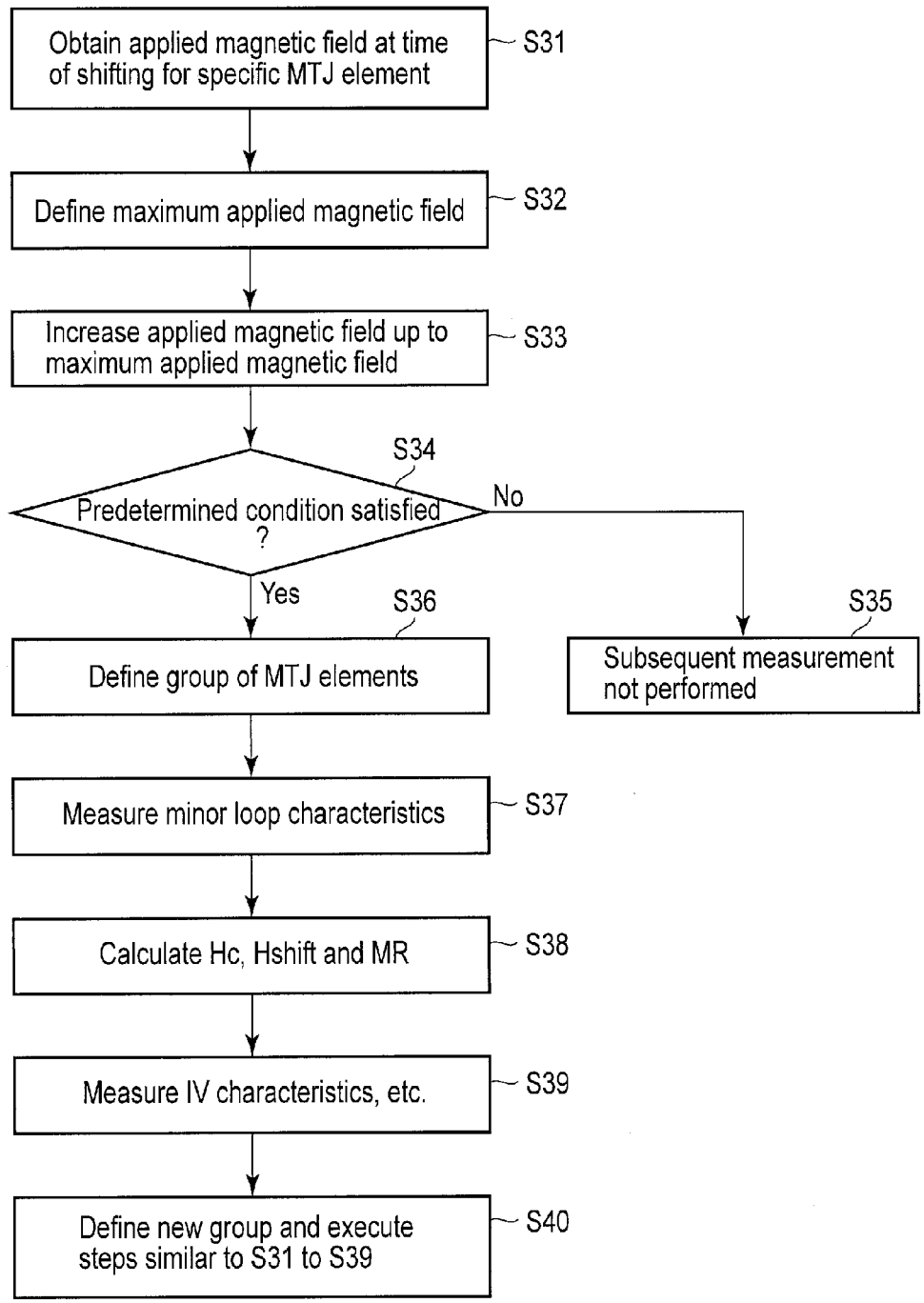
FIG. 11 is a flowchart showing a manufacturing method of a magnetic memory device according to a second embodiment (characteristics evaluation method of the magnetic memory device).

FIG. 11 is a flowchart showing a manufacturing method of a magnetic memory device according to this embodiment (characteristics evaluation method of the magnetic memory device).

Figure 12:
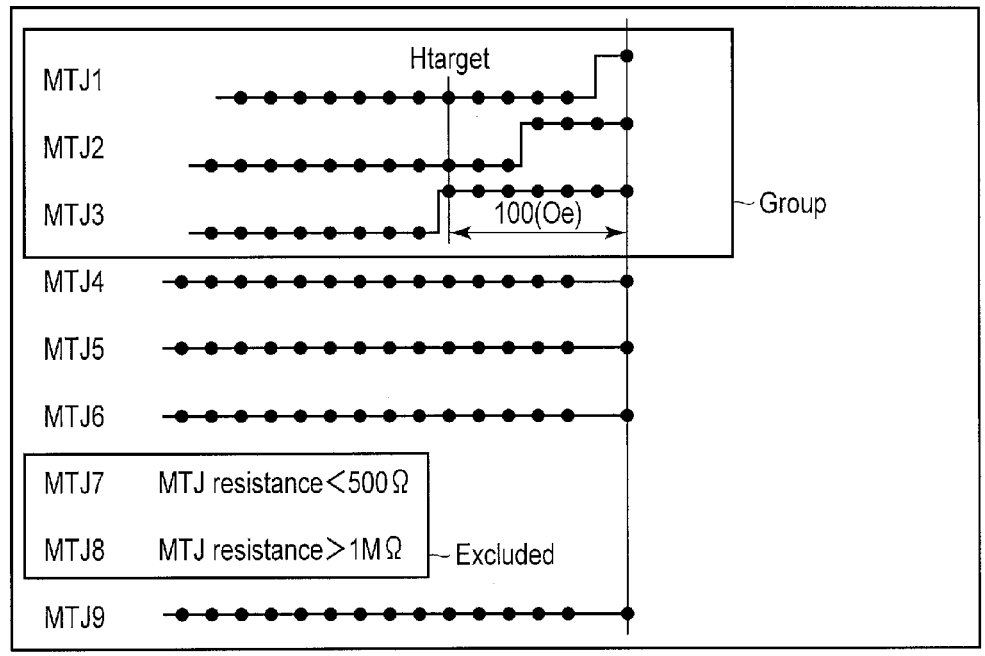
FIG. 12 is a figure for describing the method of the second embodiment.
Figure 13:
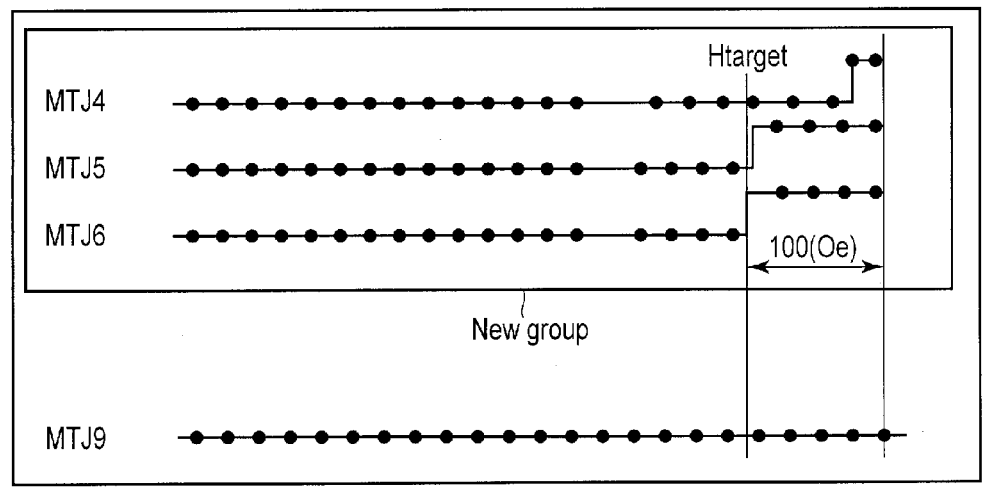
FIG. 13 is a figure for describing the method of the second embodiment.

The following description will be made with reference to also FIGS. 12 and 13. In FIGS. 12 and 13, nine MTJ elements (MTJ1 to MTJ9) are supposed as objects to be measured for simplification of description.

First, a magnetic field applied to the MTJ elements (MTJ1 to MTJ9) is increased, and an applied magnetic field at the time of shifting is obtained for the MTJ element (specific MTJ element) first shifted from a first resistance state (low-resistance state) to a second resistance state (high-resistance state) (S31). Specifically, for example, in 10 (Oe) step, the magnetic field applied to the MTJ elements (MTJ1 to MTJ9) is increased. Then, the MTJ element in which a resistance first reaches predetermined times or more (for example, 1.1 times) of resistance Rmin of the first resistance state is detected as a specific MTJ element. The applied magnetic field to the MTJ element when it is detected is defined as target magnetic field Htarget. In the example of FIG. 12, MTJ3 corresponds to the specific MTJ element.

Next, the magnetic field higher than the applied magnetic field at the time of shifting is defined as a maximum applied magnetic field (S32). For example, the magnetic field obtained by adding the magnetic field of 100 (Oe) to the applied magnetic field at the time of shifting (target magnetic field Htarget) is defined as the maximum applied magnetic field. This maximum applied magnetic field corresponds to the maximum magnetic field applied to the MTJ element when the minor loop characteristics are measured.

Usually, the above specific MTJ element (MTJ3) is kept in a high-resistance state in the magnetic field obtained by adding the magnetic field of about 100 (Oe) to the applied magnetic field at the time of shifting (target magnetic field Htarget). That is, the above specific MTJ element (MTJ3) is kept in the second resistance state (high-resistance state) when the maximum applied magnetic field is applied. Thus, the magnetic field obtained by adding the magnetic field of a predetermined value (100 (Oe)) to the applied magnetic field at the time of shifting (target magnetic field Htarget) is defined as the maximum applied magnetic field, and the minor loop characteristics are measured, as will be described below. It should be noted that the added magnetic field is not limited to 100 (Oe), and a desired value can be selected.

Next, the magnetic field applied to the MTJ elements (MTJ1 to MTJ9) is increased up to the maximum applied magnetic field (S33).

Next, whether the characteristics of the MTJ elements (MTJ1 to MTJ9) satisfy a predetermined condition or not is determined (S34). Specifically, whether the resistance of each MTJ element is between a predetermined low threshold resistance and a predetermined high threshold resistance or not is determined. If the resistance (resistance in the low-resistance state) of the MTJ element is less than the low threshold resistance (for example, 500Ω), the MTJ element is likely to have a short-circuit defect. Further, if the resistance (resistance in the high-resistance state) of the MTJ element is greater than the high threshold resistance (for example, 1 MΩ), the MTJ element is likely to have an open defect. Thus, determination as described above is performed.

If the characteristics of the MTJ element do not satisfy the predetermined condition, it is considered that the MTJ element has a defect, and a subsequent measurement is not performed (S35). In the example of FIG. 12, two MTJ elements (MTJ7 and MTJ8) do not satisfy the predetermined condition. Thus, the subsequent measurement is not performed for the two MTJ elements (MTJ7 and MTJ8).

The following steps are executed for the MTJ elements satisfying the predetermined condition.

First, a group of MTJ elements is defined (S36). The defined group includes not only the above specific MTJ element (MTJ3) but also the MTJ element shifted from the first resistance state (low-resistance state) to the second resistance state (high-resistance state) by arrival to the maximum applied magnetic field. In the example shown in FIG. 12, MTJ1 and MTJ2 as well as MTJ3 are included in the defined group.

Next, minor loop characteristics as shown in FIG. 6 are measured for each MTJ element (S37). Specifically, the magnetic characteristics (magnetic hysteresis characteristics) are obtained for each of the MTJ elements (MTJ1 to MTJ3) in the group defined as described above by applying the magnetic field decreasing from the maximum applied magnetic field after the magnetic field is increased up to the maximum applied magnetic field. Magnetic field Hc1, magnetic field Hc2, resistance Rp and resistance Rap are obtained for each MTJ element in the group from the minor loop characteristics measured in such a manner.

Next, finally necessary characteristics (parameters) Hc, Hshift and MR are calculated for each MTJ element in the group using the measurement result of the minor loop characteristics (S38).

Next, current-voltage characteristics (IV characteristics), etc., are measured for each MTJ element in the group based on the calculated characteristics (parameter) Hc, Hshift and MR (S39). For example, the current-voltage characteristics (IV characteristics), etc., are measured with such a magnetic field where Hshift is cancelled applied to the MTJ element.

In such a manner, the necessary characteristics are acquired for each of the MTJ elements (MTJ1 to MTJ3) in the group. The minor loop characteristics are measured for the MTJ elements (MTJ1 to MTJ3) in the group using the common maximum applied magnetic field. Thus, since the maximum applied magnetic field need not be set for each MTJ element, the characteristics of the MTJ elements can be efficiently acquired in a short time.

Next, steps similar to S31 to S39 are executed for the MTJ elements which do not belong to the group defined in step S36 (S40). Specific steps will be described below.

In above-described steps S31 to S39, MTJ7 and MTJ8 are excluded from measurement, and the measurement of MTJ1 to MTJ3 is terminated. Accordingly, as shown in FIG. 13, MTJ4 to MTJ6 and MTJ9 are left as objects to be measured. Thus, steps similar to steps S31 to S39 are executed for the four MTJ elements (MTJ4 to MTJ6 and MTJ9).

First, in step S31, the magnetic field applied to the MTJ elements (MTJ4 to MTJ6 and MTJ9) which do not belong to the already-defined group is increased, and a new applied magnetic field at the time of shifting (new target magnetic field Htarget) is obtained for a new specific MTJ element first shifted from the first resistance state (low-resistance state) to the second resistance state (high-resistance state). A specific method is similar to the already-described method. In the example of FIG. 13, MTJ6 corresponds to the specific MTJ element.

Next, in step S32, a new maximum applied magnetic field higher than the new applied magnetic field at the time of shifting is defined (S32). For example, the magnetic field obtained by adding the magnetic field of 100 (Oe) to the applied magnetic field at the time of shifting (new target magnetic field Htarget) is defined as a new maximum applied magnetic field. This new maximum applied magnetic field corresponds to the new maximum magnetic field applied to the MTJ element when the minor loop characteristics are measured.

Next, in step S33, the magnetic field applied to the MTJ elements (MTJ4 to MTJ6 and MTJ9) is increased up to the new maximum applied magnetic field (S33).

Next, the processing is shifted to step S34, and whether the characteristics of the MTJ elements (MTJ4 to MTJ6 and MTJ9) satisfy the predetermined condition or not is determined. It should be noted that the MTJ elements (MTJ7 and MTJ8) which do not satisfy the predetermined condition are already excluded. Thus, step S34 may be skipped.

Next, in step S36, the new group of MTJ elements is defined. The defined group includes not only the above specific MTJ element (MTJ6) but also the MTJ elements shifted from the first resistance state (low-resistance state) to the second resistance state (high-resistance state) by arrival to the maximum applied magnetic field. In the example shown in FIG. 13, MTJ4 and MTJ5 as well as MTJ6 are included in the defined new group.

Next, in step S37, the minor loop characteristics as shown in FIG. 6 are measured for each MTJ element. Specifically, the magnetic characteristics (magnetic hysteresis characteristics) are obtained for each of the MTJ elements (MTJ4 to MTJ6) in the new group by applying the magnetic field decreasing from the new maximum applied magnetic field after the magnetic field is increased up to the new maximum applied magnetic field. This causes magnetic field Hc1, magnetic field Hc2, resistance Rp and resistance Rap to be obtained for each MTJ element in the new group.

Processing similar to the already-described processing is executed also for steps S38 and S39.

In such a manner, the necessary characteristics can be acquired for each of the MTJ elements (MTJ4 to MTJ6) in the new group. The minor loop characteristics are measured for each of the MTJ elements (MTJ4 to MTJ6) in the group using a common new maximum applied magnetic field.

After the above-described processing is executed, only MTJ9 is left as the MTJ element in which the measurement of the minor loop characteristics is not executed. Thus, the group of MTJ9 is defined as a further new group, and processing similar to the above-described processing is executed for the group of MTJ9.

In such a manner, the measurement of the minor loop characteristics is executed for all the MTJ elements (MTJ1 to MTJ6 and MTJ9) except for the MTJ elements (MTJ7 and MTJ8) excluded from the objects to be measured, and the necessary characteristics are acquired using the measurement result of the minor loop characteristics.

As described above, in this embodiment, the minor loop characteristics can be measured for the MTJ elements in the group using the common maximum applied magnetic field. Accordingly, the maximum applied magnetic field need not be set for each MTJ element. Thus, the characteristics of the MTJ elements can be efficiently acquired in a short time, and characteristics evaluation of the magnetic memory device can be efficiently performed.

Further, in this embodiment, the measurement of the major loop characteristics need not be performed. Accordingly, a sufficiently high magnetic field necessary for the measurement of the major loop characteristics need not be generated. Thus, even if it is difficult to prepare a measuring device which can generate the sufficiently high magnetic field, the minor loop characteristics can be accurately acquired.

It should be noted that the method described in the above-described first embodiment or second embodiment is incorporated into the manufacturing method of the magnetic memory device and executed.

Figure 14:
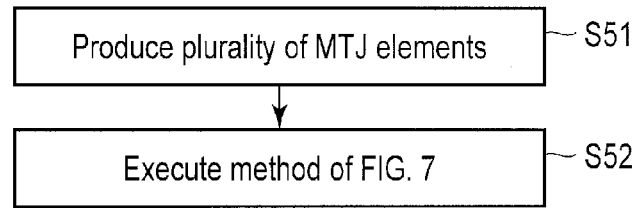
FIG. 14 is a flowchart showing a first method when the method described in the first embodiment is incorporated into the manufacturing method of the magnetic memory device.

FIG. 14 is a flowchart showing a first method when the method described in the first embodiment is incorporated into the manufacturing method of the magnetic memory device.

First, before the method of FIG. 7 is executed, that is, before the first magnetic field Hsw1 and the second magnetic field Hsw2 are obtained for each of a plurality of MTJ elements (magnetoresistive effect elements), the plurality of MTJ elements are produced (S51). The plurality of MTJ elements are, for example, MTJ elements formed on the same semiconductor wafer.

Next, the step of FIG. 7 is executed for the plurality of produced MTJ elements (S52). This causes the necessary characteristics to be acquired for each of the plurality of MTJ elements.

Figure 15:
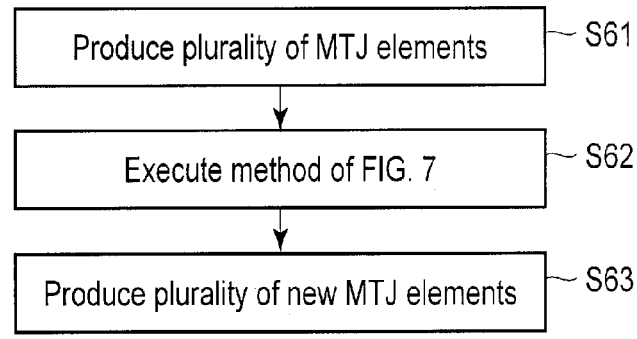
FIG. 15 is a flowchart showing a second method when the method described in the first embodiment is incorporated into the manufacturing method of the magnetic memory device.

FIG. 15 is a flowchart showing a second method when the method described in the first embodiment is incorporated into the manufacturing method of the magnetic memory device.

First, the plurality of MTJ elements (magnetoresistive effect elements) are produced (S61).

Next, the method of FIG. 7 is executed, and the magnetic characteristics of the plurality of MTJ elements are obtained (S62). The plurality of MTJ elements are, for example, MTJ elements formed on the same semiconductor wafer.

Next, a plurality of new MTJs are produced based on the obtained magnetic characteristics (S63). For example, manufacture parameters of the MTJ elements are properly changed based on the obtained magnetic characteristics. Then, the new MTJs are produced using the changed manufacture parameters.

Figure 16:
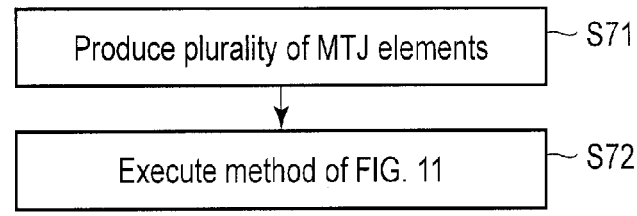
FIG. 16 is a flowchart showing a first method when the method described in the second embodiment is incorporated into the manufacturing method of the magnetic memory device.

FIG. 16 is a flowchart showing a first method when the method described in the second embodiment is incorporated into the manufacturing method of the magnetic memory device.

First, before the method of FIG. 11 is executed, that is, before the applied magnetic field at the time of shifting is obtained for the specific MTJ element (magnetoresistive effect elements), the plurality of MTJ elements are produced (S71). The plurality of MTJ elements are, for example, MTJ elements formed on the same semiconductor wafer.

Next, the step of FIG. 11 is executed for the plurality of produced MTJ elements (S72). This causes the necessary characteristics to be acquired for the plurality of MTJ elements.

Figure 17:
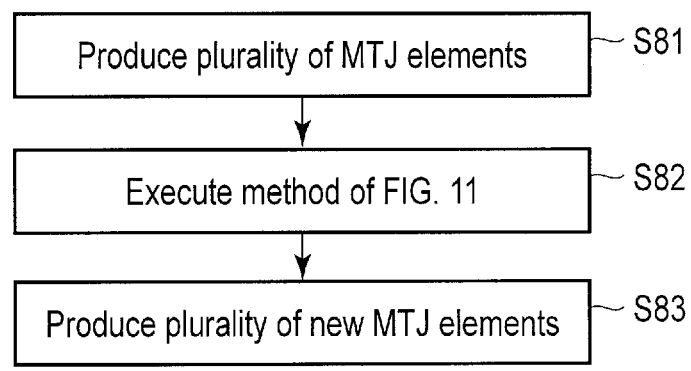
FIG. 17 is a flowchart showing a second method when the method described in the second embodiment is incorporated into the manufacturing method of the magnetic memory device.

FIG. 17 is a flowchart showing a second method when the method described in the second embodiment is incorporated into the manufacturing method of the magnetic memory device.

First, a plurality of MTJ elements (magnetoresistive effect elements) are produced (S81).

Next, the method of FIG. 11 is executed, and the magnetic characteristics of the plurality of MTJ elements are obtained (S82). The plurality of MTJ elements are, for example, MTJ elements formed on the same semiconductor wafer.

Next, the plurality of new MTJs are produced based on the obtained magnetic characteristics (S83). For example, the manufacture parameters of the MTJ elements are properly changed based on the obtained magnetic characteristics. Then, new MTJs are produced using the changed manufacture parameters.

As described above, characteristics evaluation of the magnetic memory device can be efficiently performed, and the magnetic memory device can be efficiently manufactured by incorporating the method described in the first embodiment or the second embodiment into the manufacturing method of the magnetic memory device and by executing it.

Figure 18:
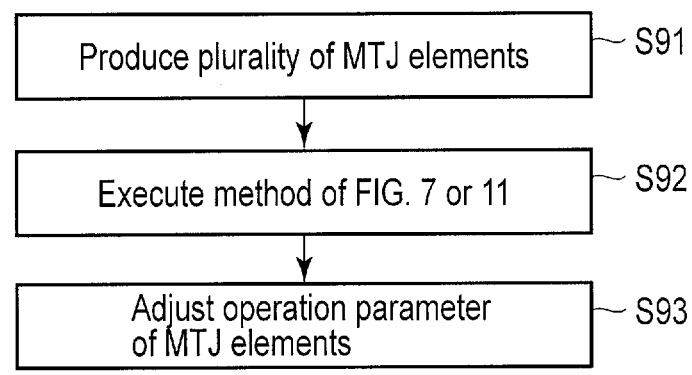
FIG. 18 is a flowchart showing a method of adjusting an operation parameter of a magnetoresistive effect element based on the method described in the first or second embodiment.

Further, an operation parameter of the MTJ element may be adjusted based on the method described in the above-described first embodiment or second embodiment. FIG. 18 is a flowchart showing a method of adjusting the operation parameter of the MTJ element.

First, a plurality of MTJ elements are produced (S91).

Next, the method of FIG. 7 or 11 is executed, and the magnetic characteristics of the plurality of MTJ elements are obtained (S92). The plurality of MTJ elements are, for example, MTJ elements formed on the same semiconductor wafer.

Next, operation parameters of the plurality of magnetoresistive effect elements are adjusted based on the obtained magnetic characteristics (S93). Specifically, an operation voltage and an operation clock for operating the magnetoresistive effect elements are adjusted.

As described above, an appropriate operation of the magnetic memory device can be secured by adjusting the operation parameters of the MTJ elements based on the method described in the first embodiment or the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a magnetic memory device comprising a plurality of magnetoresistive effect elements, each of which comprises a storage layer, a reference layer and a tunnel barrier layer provided between the storage layer and the reference layer, when an applied magnetic field is increased, the plurality of magnetoresistive effect elements being in a first resistance state if the applied magnetic field is lower than a first magnetic field, the plurality of magnetoresistive effect elements being in a second resistance state having a resistance greater than a resistance of the first resistance state if the applied magnetic field is higher than the first magnetic field and lower than a second magnetic field, and the plurality of magnetoresistive effect elements being in a third resistance state having a resistance less than the resistance of the second resistance state if the applied magnetic field is higher than the second magnetic field, the method comprising:
obtaining the first and second magnetic fields for each of the plurality of magnetoresistive effect elements;
defining a group of the plurality of magnetoresistive effect elements, for the first and second magnetic fields of the plurality of magnetoresistive effect elements in the group, a highest first magnetic field being lower than a lowest second magnetic field, and a difference between the highest first magnetic field and the lowest second magnetic field being greater than a predetermined difference;
determining a maximum applied magnetic field higher than the highest first magnetic field and lower than the lowest second magnetic field; and
obtaining magnetic characteristics for each of the plurality of magnetoresistive effect elements in the group by applying a magnetic field decreasing from the maximum applied magnetic field after the magnetic field is increased up to the maximum applied magnetic field.

2. The method of claim 1, wherein
a magnetization direction of the storage layer is parallel to a magnetization direction of the reference layer in the first and third resistance states, and
the magnetization direction of the storage layer is antiparallel to the magnetization direction of the reference layer in the second resistance state.

3. The method of claim 1, wherein
the defining the group of the plurality of magnetoresistive effect elements comprises:
determining the lowest second magnetic field from the obtained second magnetic fields; and
selecting a magnetoresistive effect element in which the obtained first magnetic field is lower than the lowest second magnetic field, and a difference between the obtained first magnetic field and the lowest second magnetic field is greater than the predetermined difference.

4. The method of claim 1, wherein
the defining the group of the plurality of magnetoresistive effect elements comprises:
determining the highest first magnetic field from the obtained first magnetic fields; and
selecting a magnetoresistive effect element in which the obtained second magnetic field is higher than the highest first magnetic field, and a difference between the obtained second magnetic field and the highest first magnetic field is greater than the predetermined difference.

5. The method of claim 1, wherein
the obtaining the magnetic characteristics comprising obtaining magnetic hysteresis characteristics.

6. The method of claim 1, further comprising
defining a new group of the plurality of magnetoresistive effect elements which do not belong to the group, wherein for the first and second magnetic fields of the plurality of magnetoresistive effect elements in the new group, a new highest first magnetic field is lower than a new lowest second magnetic field, and a difference between the new highest first magnetic field and the new lowest second magnetic field is greater than a predetermined difference;
determining a new maximum applied magnetic field which is higher than the new highest first magnetic field and lower than the new lowest second magnetic field; and
obtaining magnetic characteristics for each of the plurality of magnetoresistive effect elements in the new group by applying a magnetic field decreasing from the new maximum applied magnetic field after the magnetic field is increased up to the new maximum applied magnetic field.

7. The method of claim 1, wherein
the plurality of magnetoresistive effect elements further comprise a shift cancelling layer, and
the reference layer is provided between the tunnel barrier layer and the shift cancelling layer.

8. The method of claim 1, wherein
the plurality of magnetoresistive effect elements further comprise a shift cancelling layer, and
the storage layer is provided between the tunnel barrier layer and the shift cancelling layer.

9. The method of claim 1, further comprising
producing the plurality of magnetoresistive effect elements before the obtaining the first and second magnetic fields for each of the magnetoresistive effect elements.

10. The method of claim 1, further comprising
producing a plurality of new magnetoresistive effect elements based on the obtained magnetic characteristics after the obtaining the magnetic characteristics.

11. The method of claim 1, further comprising
adjusting an operation parameter of the plurality of magnetoresistive effect elements based on the obtained magnetic characteristics after the obtaining the magnetic characteristics.

12. A manufacturing method of a magnetic memory device comprising a plurality of magnetoresistive effect elements, each of which comprises a storage layer, a reference layer and a tunnel barrier layer provided between the storage layer and the reference layer, when an applied magnetic field is increased, the plurality of magnetoresistive effect elements being in a first resistance state if the applied magnetic field is lower than a first magnetic field, the plurality of magnetoresistive effect elements being in a second resistance state having a resistance greater than a resistance of the first resistance state if the applied magnetic field is higher than the first magnetic field and lower than a second magnetic field, and the plurality of magnetoresistive effect elements being in a third resistance state having a resistance less than the resistance of the second resistance state if the applied magnetic field is higher than the second magnetic field,
the method comprising:
increasing a magnetic field applied to the plurality of magnetoresistive effect elements to obtain an applied magnetic field at a time of shifting for a specific magnetoresistive effect element first shifted from the first resistance state to the second resistance state;
increasing the magnetic field applied to the plurality of magnetoresistive effect elements up to a maximum applied magnetic field higher than the applied magnetic field at the time of shifting;
defining a group of the plurality of magnetoresistive effect elements, the group comprising the specific magnetoresistive effect element and a magnetoresistive effect element shifted from the first resistance state to the second resistance state by arrival to the maximum applied magnetic field; and
obtaining magnetic characteristics for each of the plurality of magnetoresistive effect elements in the group by applying a magnetic field decreasing from the maximum applied magnetic field after the magnetic field is increased up to the maximum applied magnetic field.

13. The method of claim 12, wherein
a magnetization direction of the storage layer is parallel to a magnetization direction of the reference layer in the first and third resistance states, and
the magnetization direction of the storage layer is anti-parallel to the magnetization direction of the reference layer in the second resistance state.

14. The method of claim 12, wherein
the specific magnetoresistive effect element is kept in the second resistance state when the maximum applied magnetic field is applied.

15. The method of claim 12, wherein
the obtaining the magnetic characteristics comprising obtaining a magnetic hysteresis characteristics.

16. The method of claim 12, further comprising:
increasing a magnetic field applied to the plurality of magnetoresistive effect elements which do not belong to the group to obtain a new applied magnetic field at a time of shifting for a new specific magnetoresistive effect element first shifted from the first resistance state to the second resistance state;
increasing the magnetic field applied to the plurality of magnetoresistive effect elements which do not belong to the group up to a new maximum applied magnetic field higher than the new applied magnetic field at the time of shifting;
defining a new group of the plurality of magnetoresistive effect elements which do not belong to the group, the new group comprising the new specific magnetoresistive effect element and a magnetoresistive effect element shifted from the first resistance state to the second resistance state by arrival to the new maximum applied magnetic field; and
obtaining magnetic characteristics for each of the plurality of magnetoresistive effect elements in the new group by applying the magnetic field decreasing from the new maximum applied magnetic field after the magnetic field is increased up to the new maximum applied magnetic field.

17. The method of claim 12, wherein
the plurality of magnetoresistive effect element further comprise a shift cancelling layer, and
the reference layer is provided between the tunnel barrier layer and the shift cancelling layer.

18. The method of claim 12, wherein
the plurality of magnetoresistive effect elements further comprise a shift cancelling layer, and
the storage layer is provided between the tunnel barrier layer and the shift cancelling layer.

19. The method of claim 12, further comprising producing the plurality of magnetoresistive effect elements before the obtaining the applied magnetic field at the time of shifting for the specific magnetoresistive effect element.

20. The method of claim 12, further comprising producing a plurality of new magnetoresistive effect elements based on the obtained magnetic characteristics after the obtaining the magnetic characteristics.

21. The method of claim 12, further comprising adjusting an operation parameter of the plurality of magnetoresistive effect elements based on the obtained magnetic characteristics after the obtaining the magnetic characteristics.

* * * * *